United States Patent
Tanio et al.

(10) Patent No.: US 9,887,705 B2
(45) Date of Patent: Feb. 6, 2018

(54) DELTA-SIGMA MODULATOR AND MODULATION METHOD, TRANSMISSION DEVICE, AND TRANSMISSION METHOD

(71) Applicant: NEC Corporation, Minato-ku, Tokyo (JP)

(72) Inventors: Masaaki Tanio, Tokyo (JP); Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/528,164

(22) PCT Filed: Nov. 18, 2015

(86) PCT No.: PCT/JP2015/005754
§ 371 (c)(1),
(2) Date: May 19, 2017

(87) PCT Pub. No.: WO2016/088317
PCT Pub. Date: Jun. 9, 2016

(65) Prior Publication Data
US 2017/0331491 A1    Nov. 16, 2017

(30) Foreign Application Priority Data
Dec. 5, 2014    (JP) .................................. 2014-247164

(51) Int. Cl.
*H03M 3/00* (2006.01)
*H03M 7/30* (2006.01)
(Continued)

(52) U.S. Cl.
CPC ............ *H03M 7/304* (2013.01); *G06F 7/602* (2013.01); *H03F 3/24* (2013.01); *H03L 7/0816* (2013.01);
(Continued)

(58) Field of Classification Search
CPC .. H03M 7/304; H03M 7/3015; H03M 7/3011; H03M 3/02; H03L 7/0816;
(Continued)

(56) References Cited

U.S. PATENT DOCUMENTS 7,013,090 B2 *   3/2006   Adachi ..................... H03F 3/24
                                                                398/183
7,881,399 B2 *   2/2011   Matsuura ................ H03M 3/51
                                                                332/120

FOREIGN PATENT DOCUMENTS

JP    2009-517912 A    4/2009
JP    2011-61517 A    3/2011
(Continued)

OTHER PUBLICATIONS

Antoine Frappe et al., "An All-Digital RF Signal Generator Using High-Speed ΔΣ Modulators", IEEE Journal of Solid-State Circuits, Oct. 2009, vol. 44, No. 10, pp. 2722-2732.
(Continued)

*Primary Examiner* — Khai M Nguyen

(57) ABSTRACT

The purpose of the present invention is to provide a high-power-efficiency and low-design-cost transmission device by implementing, with a constant clock, delta-sigma modulation maintaining a zero current switching property in an amplifier. This delta-sigma modulator comprises: a pulse phase signal generation unit for generating a pulse phase signal from a phase signal; a delta-sigma modulation unit for generating a pulse amplitude signal obtained by delta-sigma modulating an amplitude signal with a constant clock; a phase sorting unit for outputting a control signal on the basis of the phase signal; a delay switching unit for delaying the pulse amplitude signal on the basis of the control signal; and a mixing unit for outputting a pulse string obtained by multiplying together the delayed pulse amplitude signal and the pulse phase signal.

9 Claims, 13 Drawing Sheets

(51) Int. Cl.
| | |
|---|---|
| H04B 14/06 | (2006.01) |
| H03L 7/197 | (2006.01) |
| G06F 7/60 | (2006.01) |
| H03F 3/24 | (2006.01) |
| H03M 3/02 | (2006.01) |
| H04L 27/36 | (2006.01) |
| H03L 7/081 | (2006.01) |

(52) U.S. Cl.
CPC ............ *H03L 7/1976* (2013.01); *H03M 3/02* (2013.01); *H03M 7/3011* (2013.01); *H03M 7/3015* (2013.01); *H04B 14/062* (2013.01); *H04L 27/36* (2013.01)

(58) Field of Classification Search
CPC ..... H03L 7/1976; H04B 14/062; G06F 7/602; H03F 2200/331; H03F 3/24; H04L 27/2092; H04L 27/36; H04L 27/361
USPC .......................................... 341/143; 375/295
See application file for complete search history.

(56) References Cited

FOREIGN PATENT DOCUMENTS

| | | |
|---|---|---|
| JP | 5360232 B2 | 12/2013 |
| WO | 2012/033182 A1 | 3/2012 |

OTHER PUBLICATIONS

Takashi Maehata et al., "High ACLR 1-bit Direct Radio Frequency Converter Using Symmetric Waveform", Proceeding of the 42nd European Microwave Conference, Oct. 29-Nov. 1, 2012, pp. 1051-1024.
Michael Nielsen et al., "A Transmitter Architecture Based on Delta-Sigma Modulation and Switch-Mode Power Amplification", IEEE Transactions on Circuits and Systems—II: Express Briefs, Aug. 2007, vol. 54, No. 8, pp. 735-739.
Yuanxun Wang, "An Improved Kahn Transmitter Architecture Based on Delta-Sigma Modulation", IEEE MTT-S Digest, 2003, IFWE-34, pp. 1327-1330.
Alexandre Dupuy et al., "High Efficiency Power Transmitter Based on Envelope Delta-Sigma Modulation (EDSM)", IEEE, 2004, pp. 2092-2095.
International Search Report dated Dec. 22, 2015, issued by the International Searching Authority in application No. PCT/JP2015/005754.
Written Opinion of the International Searching Authority dated Dec. 22, 2015, issued by the International Searching Authority in application No. PCT/JP2015/005754.
Takashi Maehata et al., "High ACLR 1-bit Direct Radio Frequency Converter Using Symmetric Waveform", Proceeding of the 7th European Microwave Integrated Circuits Conference, Oct. 29-30, 2012, pp. 671-674.

* cited by examiner

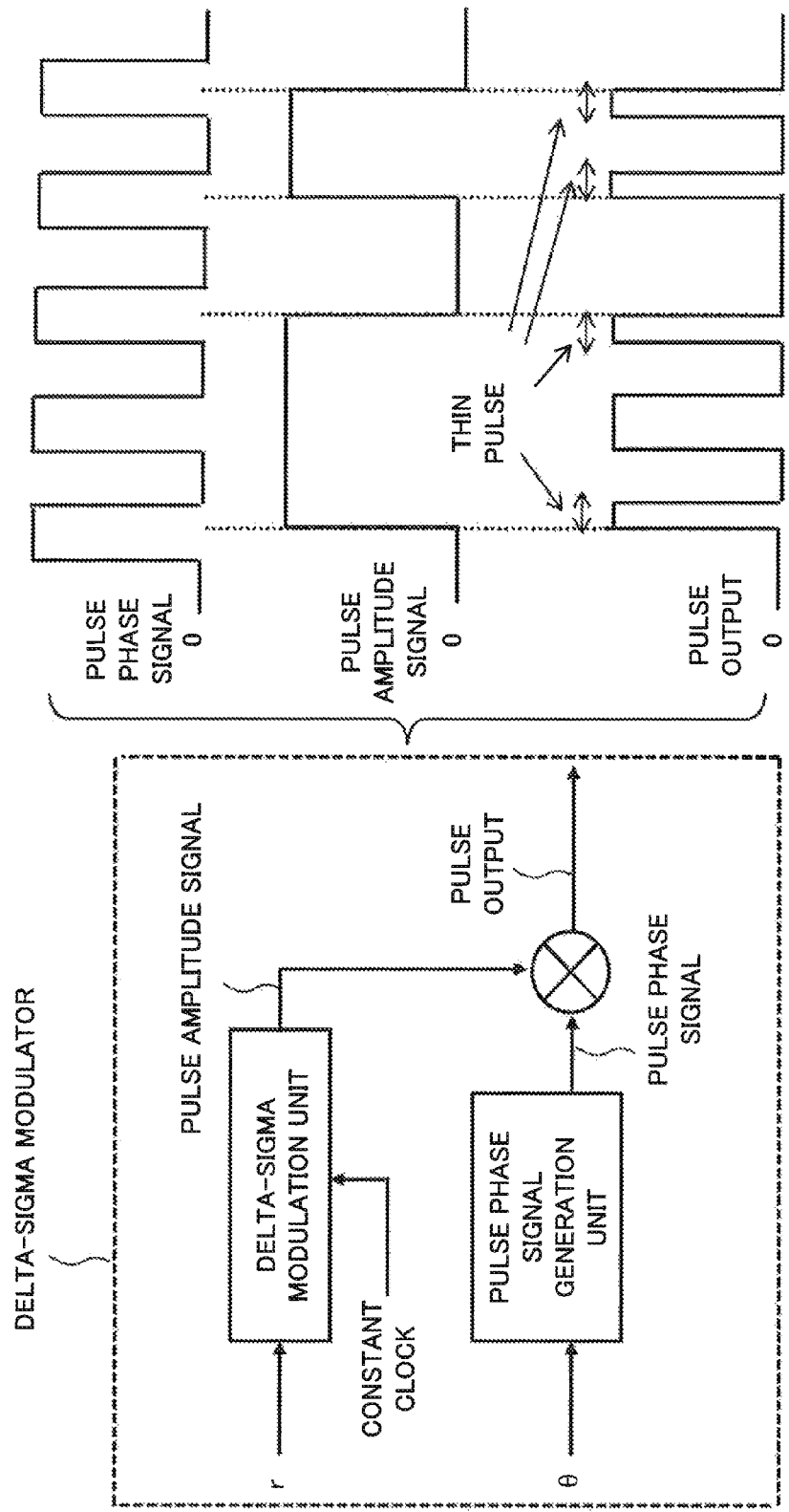

DELTA-SIGMA MODULATOR AND MODULATION METHOD, TRANSMISSION DEVICE, AND TRANSMISSION METHOD

This application is a National Stage Entry of PCT/JP2015/005754 filed on Nov. 18, 2015, which claims priority from Japanese Patent Application 2014-247164 filed on Dec. 5, 2014, the contents of all which are incorporated herein by reference, in the entirety.

TECHNICAL FIELD

The present invention relates to a digital transmission technology, and particularly, relates to a technique of delta-sigma modulating a signal for transmission.

BACKGROUND ART

A transmitter for use in communication and broadcasting equipment, such as a portable telephone system and wireless Local Area Network (LAN) equipment, is required to operate with low power consumption while maintaining a transmission waveform at high accuracy independently of a level of transmission power. In recent years, a digital transmitter using a delta-sigma modulator and a class-D amplifier in combination has attracted attention as a transmitter that is expected to provide high power efficiency. As illustrated in FIG. 10, the digital transmitter includes a baseband signal generator, a delta-sigma modulator, a class-D amplifier, a band-pass filter, and an antenna.

An input signal generated by the baseband signal generator is delta-sigma modulated by the delta-sigma modulator and quantized into a binary pulse string. The binary pulse string thus generated is amplified by the class-D amplifier while maintaining a pattern of the pulse string. Further, by being passed through the band-pass filter, the input signal in an amplified state is reconstructed. The class-D amplifier, which occupies most of power in the digital transmitter, can obtain theoretically 100% power conversion efficiency unless there is power loss caused by a parasitic element. Thus, the transmitter is expected to have higher efficiency as a whole.

Modulation schemes of the delta-sigma modulator in the digital transmitter include envelope delta-sigma modulation, low-pass delta-sigma modulation, and band-pass delta-sigma modulation. Configuration examples of the respective modulation schemes are disclosed in PTL 1, NPL 1, and NPL 2.

FIG. 11 illustrates a configuration of an envelope delta-sigma modulator disclosed in PTL 1. In a digital baseband, an I-component and a Q-component of an input signal generated by a baseband signal generator (not illustrated in the figure) are generated. An amplitude-phase conversion unit converts the I-component and the Q-component into an amplitude component r and a phase component θ. A pulse phase signal generation unit generates, based on the phase component θ, a pulse phase signal at a radio frequency (RF). A delta-sigma modulation unit delta-sigma modulates the amplitude component r with the pulse phase signal as a clock and generates a pulse amplitude signal. Finally, by multiplying the pulse phase signal by the pulse amplitude signal, a pulse string of a pulse modulation signal is generated and output.

The envelope delta-sigma modulation scheme has an advantage that zero current switching is established in a digital amplifier. FIG. 12 is a diagram describing a principle of zero current switching. A class-D amplifier in FIG. 12, which corresponds to the class-D amplifier in FIG. 10, amplifies voltage of a pulse generated by a delta-sigma modulator and outputs the voltage. At this time, looking at an output voltage ($V_{OUT}$) and an output current ($I_{OUT}$), the output current always becomes 0 at switching points of the output voltage.

When a large output current is generated in a process of switching of an output voltage from High to Low and from Low to High, IV overlapping occurs in a switching element of a class-D amplifier, which may possibly cause power loss at the class-D amplifier. In a case of the envelope delta-sigma modulation scheme, since a phase of a pulse string always matches with a phase of a desired frequency included in the pulse string, an output current always becomes 0 at timings of voltage switch of the pulse string. As a result, no power loss is generated by IV overlapping. Thus, the class-D amplifier realizes further higher-efficiency amplification.

CITATION LIST

Patent Literature

[PTL 1] Japanese Patent No. 5360232

Non Patent Literature

[NPL 1] Antoine Frappe, "An All-Digital RF Signal Generator Using High-Speed Modulators", IEEE JOURNAL OF SOLID-STATE CIRCUITS, VOL. 44, NO. 10, pp. 2722-2732, 2009.

[NPL 2] T. Maehata, S. Kameda, and N. Suematsu, "High ACLR 1-bit Direct Radio Frequency Converter Using Symmetric Waveform," Proc. 42nd European Microwave Conf., pp. 1051-1054, November 2012.

SUMMARY OF INVENTION

Technical Problem

An operation clock of the delta-sigma modulation unit in the envelope delta-sigma modulation scheme is unsteady since the operation clock is a pulse phase signal and thus contains a phase component. A design of a delta-sigma modulation unit with use of such an unsteady clock is required to support exceptional cases due to the unsteadiness, and thus, an advanced special purpose design is necessary. As a result, there arises a problem of high design cost.

On the other hand, a delta-sigma modulation unit may be in principle implemented by using a constant clock, even rather than using a pulse phase signal as a clock, in a simplified manner with a digital circuit design using a hardware description language. FIG. 13 is a diagram describing this. A difference between the delta-sigma modulator in FIG. 11 disclosed in PTL 1 and a delta-sigma modulator in FIG. 13 resides in that the delta-sigma modulator in FIG. 13 operates a delta-sigma modulation unit with a constant clock. A pulse output generated by the delta-sigma modulator is amplified by a class-D amplifier and passed through a band-pass filter, and thereby a desired output signal can be obtained, similarly to the delta-sigma modulator in FIG. 11.

However, a pulse amplitude signal generated in FIG. 13 is not in synchronization with a pulse phase signal. Thus, an output pulse string generated by mixing the both signals takes a High value at a timing shifted from a switch timing of the pulse phase signal, which in many cases results in generating a thin pulse that is a short interval for which a High value is taken (see right in FIG. 13). The thin pulse switches from Low to High at a timing shifted from a timing at which an output current in the class-D amplifier becomes 0. Thus, when the delta-sigma modulation unit is operated simply with the constant clock, a zero current switching property is lost in the amplifier and power efficiency is lowered. PTL 1 neither discloses nor suggests a method of solving this problem.

The present invention has been made in light of the above-described problem, and an object of the present invention is to provide a high-power-efficiency and low-design-cost transmission device by implementing, with a constant clock, delta-sigma modulation maintaining a zero current switching property in an amplifier.

Solution to Problem

A delta-sigma modulator according to the present invention includes: a pulse phase signal generation unit that generates a pulse phase signal from a phase signal; a delta-sigma modulation unit that generates a pulse amplitude signal obtained by delta-sigma modulating an amplitude signal with a constant clock; a phase sorting unit that outputs, based on the phase signal, a control signal; a delay switching unit that delays, based on the control signal, the pulse amplitude signal; and a mixing unit that outputs a pulse string obtained by multiplying the delayed pulse amplitude signal by the pulse phase signal.

A delta-sigma modulation method according to the present invention includes: generating a pulse phase signal from a phase signal; generating a pulse amplitude signal obtained by delta-sigma modulating an amplitude signal with a constant clock; delaying, based on the phase signal, the pulse amplitude signal; and outputting a pulse string obtained by multiplying the delayed pulse amplitude signal by the pulse phase signal.

A transmission device according to the present invention includes a signal generator, a delta-sigma modulator, an amplifier, and a band-pass filter, wherein the signal generator generates a baseband signal as an input signal, the delta-sigma modulator includes: a digital baseband unit that generates an IQ signal from the baseband signal; an amplitude-phase conversion unit that converts the IQ signal into an amplitude signal and a phase signal; a pulse phase signal generation unit that generates a pulse phase signal from the phase signal; a delta-sigma modulation unit that generates a pulse amplitude signal obtained by delta-sigma modulating the amplitude signal with a constant clock; a phase sorting unit that outputs, based on the phase signal, a control signal; a delay switching unit that delays, based on the control signal, the pulse amplitude signal; and a mixing unit that outputs a pulse string obtained by multiplying the delayed pulse amplitude signal by the pulse phase signal, the amplifier amplifies the pulse string, and the band-pass filter generates an output signal obtained by reconstructing the amplified input signal by passing the amplified pulse string.

A transmission method according to the present invention includes: generating an IQ signal from a baseband signal as an input signal; converting the IQ signal into an amplitude signal and a phase signal; generating a pulse phase signal from the phase signal; generating a pulse amplitude signal obtained by delta-sigma modulating the amplitude signal with a constant clock; delaying, based on the phase signal, the pulse amplitude signal; outputting a pulse string obtained by multiplying the delayed pulse amplitude signal by the pulse phase signal; amplifying the pulse string; and generating and transmitting an output signal obtained by reconstructing the amplified input signal by passing the amplified pulse string through a band-pass filter.

Advantageous Effects of Invention

According to the present invention, a high-power-efficiency and low-design-cost transmission device is provided by enabling to implement, with a constant clock, delta-sigma modulation maintaining a zero current switching property in an amplifier.

BRIEF DESCRIPTION OF DRAWINGS

FIG. 13 is a diagram describing an operation of a delta-sigma modulator performing delta-sigma modulation with a constant clock.

DESCRIPTION OF EMBODIMENTS

Example embodiments of the present invention will be described below in detail with reference to the drawings. However, the example embodiments described below include technically preferable limitations to carry out the present invention, but the scope of the invention is not limited to the following.

(First Example Embodiment)

Figure 1:
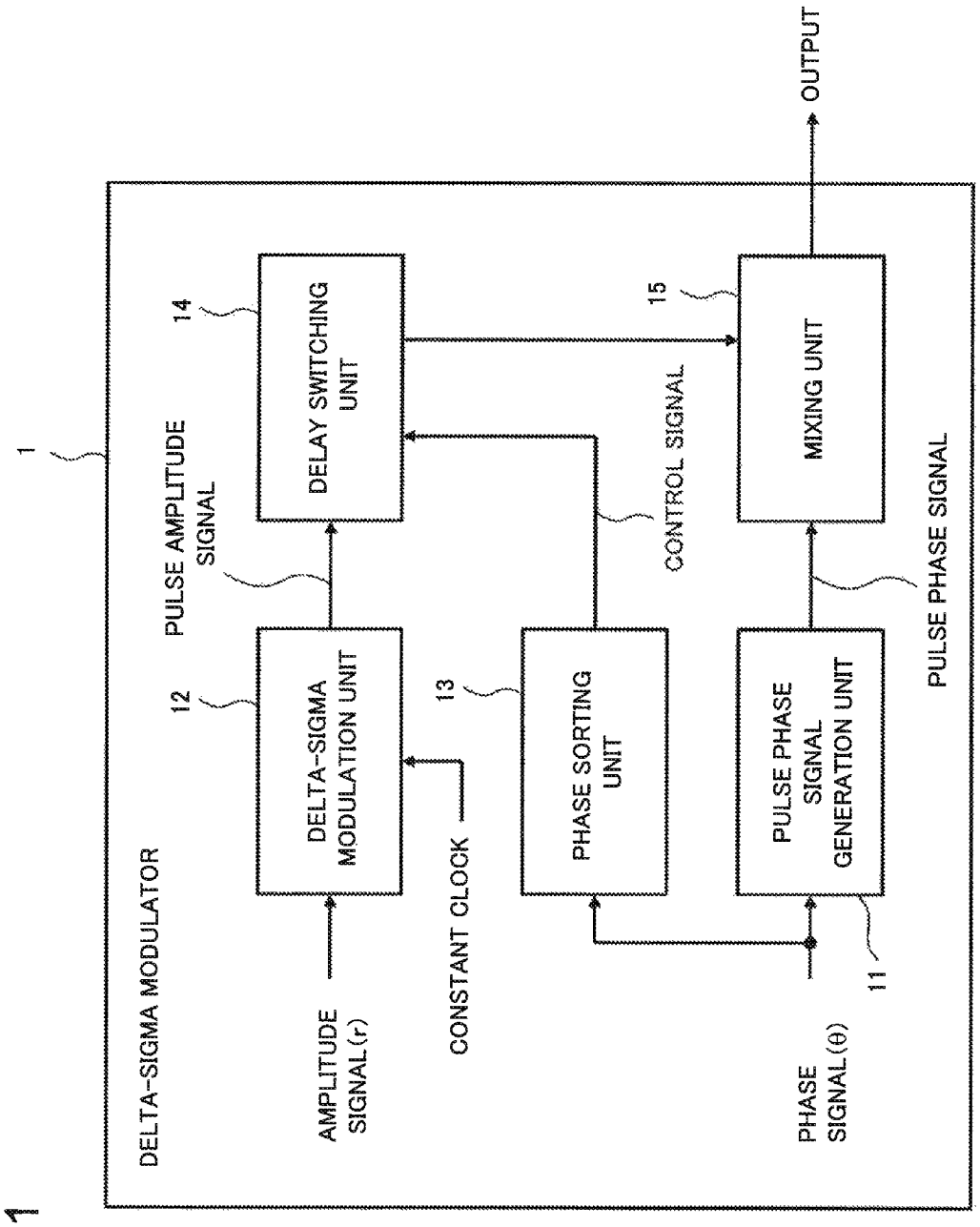
FIG. 1 is a block diagram illustrating a configuration of a delta-sigma modulator according to a first example embodiment of the present invention.

FIG. 1 is a block diagram illustrating a configuration of a delta-sigma converter according to a first example embodiment of the present invention. A delta-sigma converter 1 according to the present example embodiment includes a pulse phase signal generation unit 11 that generates a pulse phase signal from a phase signal, and a delta-sigma modulation unit 12 that generates a pulse amplitude signal obtained by delta-sigma modulating an amplitude signal with a constant clock.

Further, the delta-sigma converter 1 includes a phase sorting unit 13 that outputs, based on the phase signal, a control signal, and a delay switching unit 14 that delays, based on the control signal, the pulse amplitude signal. Further, the delta-sigma converter 1 includes a mixing unit 15 that outputs a pulse string obtained by multiplying the delayed pulse amplitude signal by the pulse phase signal.

Note that a direction of an arrow in FIG. 1 indicates an example, but is not intended to limit a direction of a signal between blocks.

In a delta-sigma conversion method according to the present example embodiment, a pulse phase signal is generated from a phase signal, and a pulse amplitude signal obtained by delta-sigma modulating an amplitude signal with a constant clock is generated. Further, the pulse amplitude signal is delayed based on the phase signal, and a pulse string obtained by multiplying the delayed pulse amplitude signal by the pulse phase signal is output.

According to the present example embodiment, a high-power-efficiency and low-design-cost transmission device is provided by enabling to implement, with a constant clock, delta-sigma modulation maintaining a zero current switching property in an amplifier.

(Second Example Embodiment)

Figure 2:
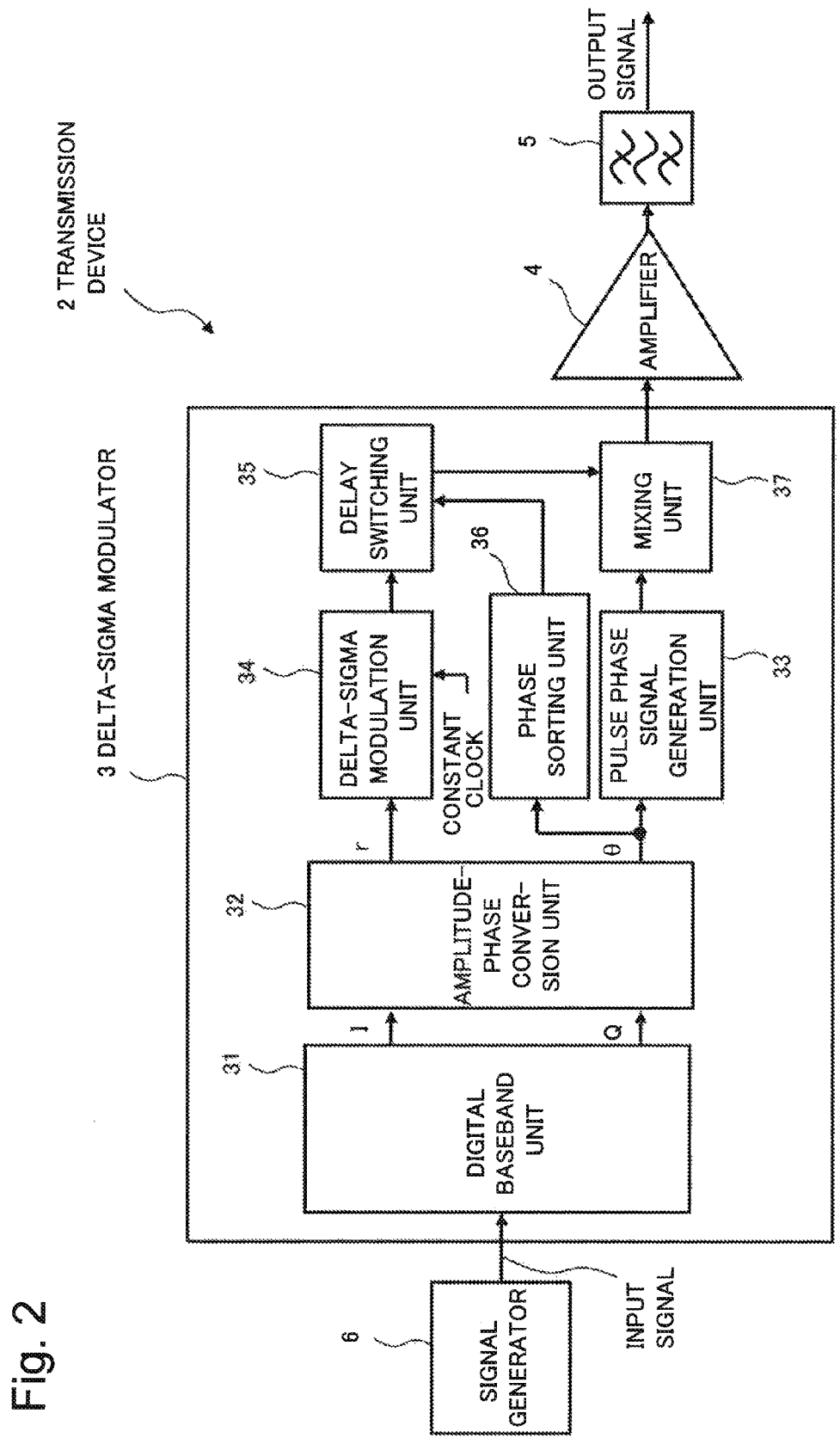
FIG. 2 is a block diagram illustrating a configuration of a transmission device according to a second example embodiment of the present invention.

FIG. 2 is a block diagram illustrating a configuration of a transmission device according to a second example embodiment of the present invention. A transmission device 2 according to the present example embodiment includes a signal generator 6, a delta-sigma modulator 3, an amplifier 4, and a band-pass filter 5. The signal generator 6 generates a baseband signal as an input signal.

The delta-sigma modulator 3 includes a digital baseband unit 31 that generates an IQ signal from the baseband signal, and an amplitude-phase conversion unit 32 that converts the IQ signal into an amplitude signal and a phase signal. Further, the delta-sigma modulator 3 includes a pulse phase signal generation unit 33 that generates a pulse phase signal from the phase signal, and a delta-sigma modulation unit 34 that generates a pulse amplitude signal obtained by delta-sigma modulating the amplitude signal with a constant clock. Further, the delta-sigma modulator 3 includes a phase sorting unit 36 that outputs, based on the phase signal, a control signal, and a delay switching unit 35 that delays, based on the control signal, the pulse amplitude signal. Further, the delta-sigma modulator 3 includes a mixing unit 37 that outputs a pulse string obtained by multiplying the delayed pulse amplitude signal by the pulse phase signal.

The amplifier 4 amplifies the pulse string, and the band-pass filter 5 generates an output signal obtained by reconstructing the amplified input signal by passing through the amplified pulse string.

Note that a direction of an arrow in FIG. 2 indicates an example, but is not intended to limit a direction of a signal between blocks.

In a transmission method according to the present example embodiment, an IQ signal is generated from a baseband signal as an input signal, and the IQ signal is converted into an amplitude signal and a phase signal. Further, a pulse phase signal is generated from the phase signal, and a pulse amplitude signal obtained by delta-sigma modulating the amplitude signal with a constant clock is generated. Further, the pulse amplitude signal is delayed based on the phase signal, and a pulse string obtained by multiplying the delayed pulse amplitude signal by the pulse phase signal is output. Further, the pulse string is amplified by an amplifier, and an output signal obtained by reconstructing the amplified input signal by passing the amplified pulse string through a band-pass filter is generated.

According to the present example embodiment, the delay switching unit 35 delays, based on the control signal from the phase sorting unit 36, the pulse amplitude signal. Thereby, the pulse amplitude signal is synchronized with the pulse phase signal, and thus generation of a thin pulse can be prevented. Accordingly, a zero current switching property in an amplifier is maintained. Therefore, according to the present example embodiment, a high-power-efficiency and low-design-cost transmission device is provided by enabling to implement, with a constant clock, delta-sigma modulation maintaining a zero current switching property in an amplifier.

(Third Example Embodiment)

Figure 3:
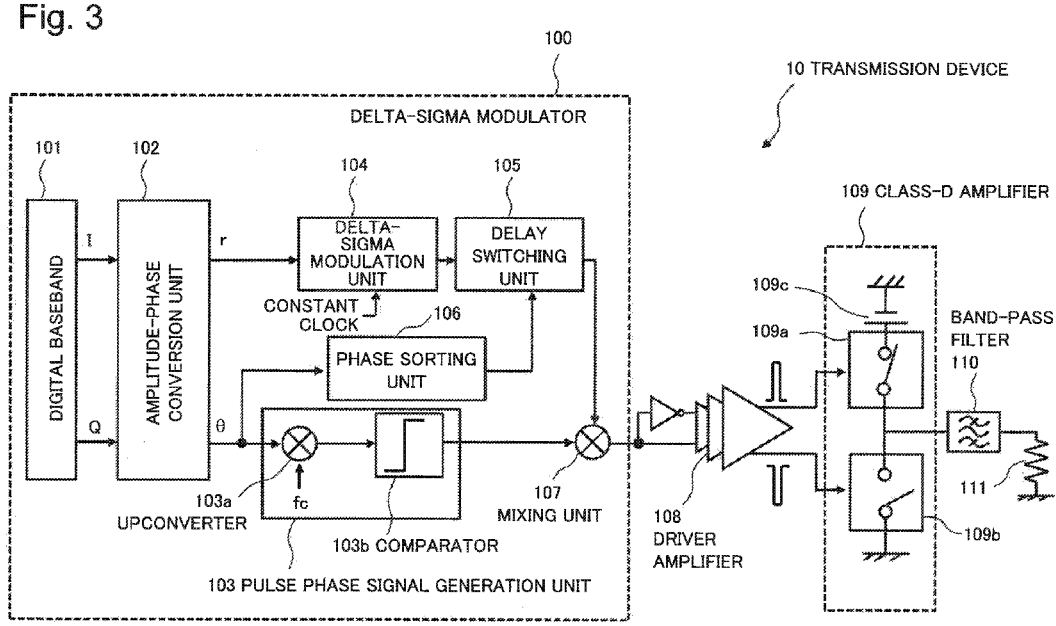
FIG. 3 is a block diagram illustrating a configuration of a transmission device according to a third example embodiment of the present invention.

FIG. 3 is a block diagram illustrating a configuration of a transmission device according to a third example embodiment of the present invention. A transmission device 10 according to the present example embodiment includes a delta-sigma modulator 100 that includes a digital baseband 101, an amplitude-phase conversion unit 102, a pulse phase signal generation unit 103, a delta-sigma modulation unit 104, a delay switching unit 105, a phase sorting unit 106, and a mixing unit 107. Further, the transmission device 10 includes a driver amplifier 108, a class-D amplifier 109, a band-pass filter 110, and a load 111.

In the delta-sigma modulator 100, the digital baseband 101 generates, from a baseband signal as an input signal generated by a signal generator (not shown in the figure), an IQ signal that is an orthogonal radio signal.

The amplitude-phase conversion unit 102 divides the IQ signal and extracts an amplitude signal r and a phase signal $\theta$ therefrom. The amplitude signal r is supplied to the delta-sigma modulation unit 104 having a constant clock frequency, and the phase signal $\theta$ is supplied to the pulse phase signal generation unit 103 and the phase sorting unit 106.

The pulse phase signal generation unit 103 includes an upconverter 103a and a comparator 103b. The upconverter 103a upconverts the supplied phase signal $\theta$ into a RF phase signal by mixing with a carrier frequency fc, and outputs the RF phase signal. The RF phase signal is set High for a value equal to or greater than a threshold value 0 and Low for a value less than the threshold value 0 by the comparator 103b. Accordingly, a pulse phase signal that goes High when the phase signal $\theta$ ranges from 0° to 180° and Low when the phase signal $\theta$ ranges from 180° to 360° is generated and supplied to the mixing unit 107.

Note that the pulse phase signal generation unit 103 is not limited to the above configuration, but can be also implemented by digitalizing, with use of an All Digital Phase-locked loop (ADPLL) or the like, all of circuits for upconversion and phase addition.

The delta-sigma modulation unit 104 converts the amplitude signal r into a pulse-waveform pulse amplitude signal under an externally given constant clock.

The delay switching unit 105 adds, to the pulse amplitude signal, a delay amount based on a control signal to be supplied from the phase sorting unit 106, and supplies the pulse amplitude signal to the mixing unit 107.

The phase sorting unit 106 determines which region of predesignated region divisions a value of the supplied phase signal θ is included, and supplies a determination result as the control signal to the delay switching unit 105.

The mixing unit 107 generates a pulse string of a pulse modulation signal by multiplying the pulse phase signal by the pulse amplitude signal, and outputs the pulse string. The mixing unit 107 outputs a low level when the pulse amplitude signal is Low, and outputs a level equivalent to the pulse phase signal when the pulse amplitude signal is High. Note that the mixing unit 107 is implemented by a logic element such as an AND circuit.

The delay amount to be switched by the delay switching unit 105 is adjusted in such a manner that a timing at which the pulse amplitude signal to be input to the mixing unit 107 changes from Low to High occurs at a timing at which the pulse phase signal is Low. In other words, a timing at which the pulse phase signal goes High is predictable in advance from a value of the phase signal θ. Hence, by the phase sorting unit 106 predicting, based on the value of the phase signal θ, the timing at which the pulse phase signal is Low in advance, the delay switching unit 105 becomes able to add a delay amount corresponding to a prediction result to the pulse amplitude signal.

Figure 4:
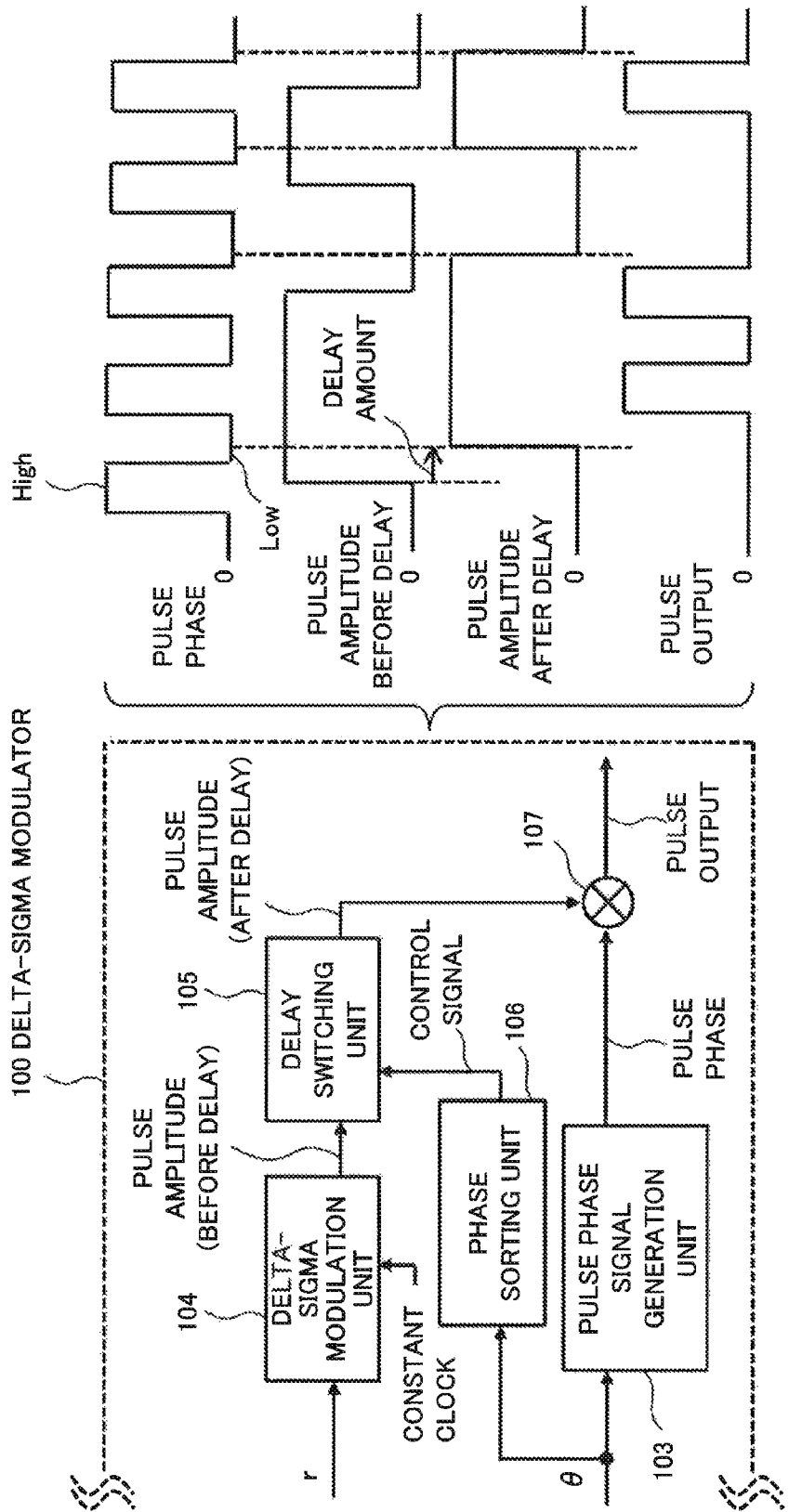
FIG. 4 is a diagram describing a function of a delta-sigma modulator according to the third example embodiment of the present invention.

FIG. 4 is a diagram describing a function of the phase sorting unit 106 and the delay switching unit 105 in the delta-sigma modulator 100. The phase sorting unit 106 predicts, based on the phase signal θ, a timing at which the pulse phase signal is Low (0) in advance. A prediction result is sent as the control signal to the delay switching unit 105. The delay switching unit 105 adds a delay amount based on the prediction result to a pulse amplitude signal string. Accordingly, generation of a thin pulse (see FIG. 13) can be prevented at a time of delta-sigma modulation with a constant clock, and a zero current switching property in a class-D amplifier is maintained.

The driver amplifier 108, upon receiving the pulse string of the pulse modulation signal from the delta-sigma modulator 11, inputs the pulse string of the pulse modulation signal and a complementary signal thereof to the class-D amplifier 109.

The class-D amplifier 109 is constituted of a power supply 109c, a switching element 109a, and a switching element 109b connected in series between grounds (GND). The switching elements 109a and 109b can be implemented by using a Metal Oxide Semiconductor (MOS) transistor or a bipolar transistor. The switching elements 109a and 109b are supplied with the output signal of the mixing unit 107 and the complementary signal thereof that are input via the driver amplifier 108. The class-D amplifier 109 outputs an output signal obtained by amplifying a pulse voltage signal having a pulse waveform being the same as that input to the switching element.

The band-pass filter 110 selects and passes only a desired RF signal included in the pulse voltage signal output from the class-D amplifier 109. Accordingly, the input signal in an amplified state is reconstructed. The band-pass filter 110 is connected with, at a next stage thereof, an antenna as the load 111, whereby the RF signal is reproduced.

With the above configurations and the operations of the delta-sigma modulator 100, zero current switching in the class-D amplifier 109 is achieved. Note that, among the above configurations, the driver amplifier 108 can be also interpreted as a part of the class-D amplifier 109. The present example embodiment also includes such a configuration.

In addition, among the above configurations, when total processing time of the delta-sigma modulation unit 104 and the delay switching unit 105 is largely different from processing time of the pulse phase signal generation unit 103, the mixing unit 107 becomes unable to synchronize the pulse amplitude signal with the pulse phase signal, which results in causing signal distortion. Thus, in a case in which total processing time of the delta-sigma modulation unit 104 and the delay switching unit 105 is larger, synchronization is enabled by delaying a signal before input or immediately after output of the pulse phase signal generation unit 103. Conversely, in a case in which processing time of the pulse phase signal generation unit 103 is larger, synchronization is enabled by delaying a signal before input or immediately after output of the delta-sigma modulation unit 104 or the delay switching unit 105. Note that the delay adjustment described above can be applied to all the example embodiments of the present invention.

Note that a direction of an arrow in FIGS. 3 and 4 indicates an example, but is not intended to limit a direction of a signal between blocks.

As described above, according to the present example embodiment, the delay switching unit 105 delays, based on the control signal from the phase sorting unit 106, the pulse amplitude signal. Thereby, the pulse amplitude signal is synchronized with the pulse phase signal, and thus generation of a thin pulse can be prevented. Accordingly, a zero current switching property in an amplifier is maintained. Therefore, according to the present example embodiment, a high-power-efficiency and low-design-cost transmission device is provided by enabling to implement, with a constant clock, delta-sigma modulation maintaining a zero current switching property in an amplifier.

(Fourth Example Embodiment)

Figure 5:
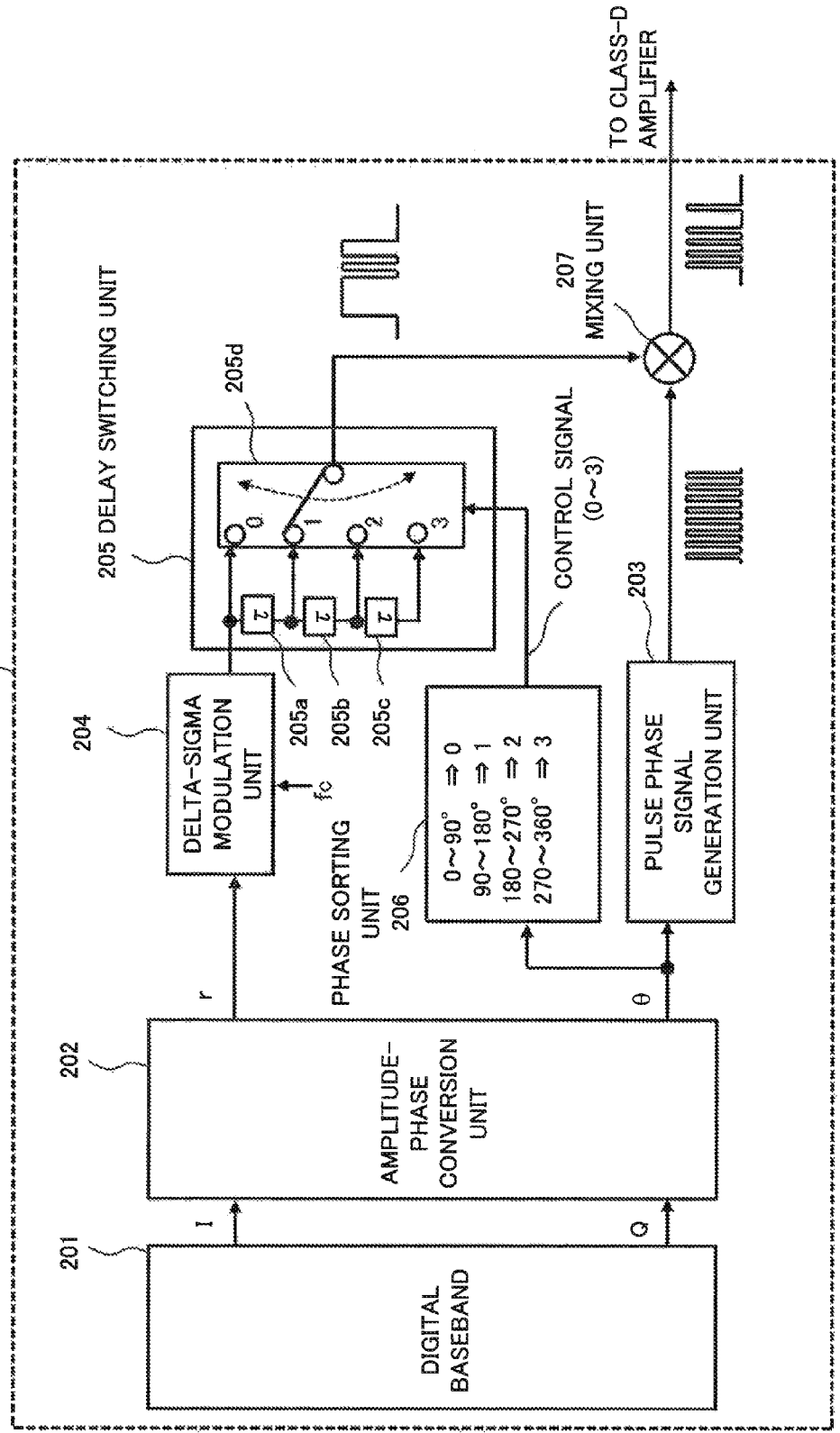
FIG. 5 is a block diagram illustrating a configuration of a delta-sigma modulator according to a fourth example embodiment of the present invention.

A transmission device according to a fourth example embodiment of the present invention has a configuration in which the delta-sigma modulator 100 of FIG. 3 is replaced with a delta-sigma modulator 200 of FIG. 5. A delay switching unit 205 and a phase sorting unit 206 of the delta-sigma modulator 200 indicate specific configuration examples of the delay switching unit 105 and the phase sorting unit 106 of the delta-sigma modulator 100.

FIG. 5 is a block diagram illustrating a configuration of the delta-sigma modulator according to the present example embodiment. The delta-sigma modulator 200 in FIG. 5 includes a digital baseband 201, an amplitude-phase conversion unit 202, a pulse phase signal generation unit 203, a delta-sigma modulation unit 204, the delay switching unit 205, the phase sorting unit 206, and a mixing unit 207. Note that the digital baseband 201, the amplitude-phase conversion unit 202, the pulse phase signal generation unit 203, and the mixing unit 207 are the same as the digital baseband 101, the amplitude-phase conversion unit 102, the pulse phase signal generation unit 103, and the mixing unit 107 in FIG. 3, respectively, and thus, description of operations therefor will be omitted.

The delta-sigma modulation unit 204 delta-sigma modulates a supplied amplitude signal r with a clock having a switch frequency fc being the same as a carrier frequency fc, generates a pulse amplitude signal, and supplies the pulse amplitude signal to the delay switching unit 205.

The phase sorting unit 206 sets "0", "1", "2", and "3" to a value of a control signal when a value of an input phase signal θ ranges from 0° to 90°, 90° to 180°, 180° to 270°, and 270° to 360°, respectively, and outputs the control signal to the delay switching unit 205.

The delay switching unit 205 includes a delay 205a, a delay 205b, a delay 205c, and an output switching unit 205d. Delay amounts of the delay 205a, the delay 205b, and the delay 205c are set as 1/4 times (1/(4fc)) a period of the carrier frequency fc. The delays are arranged in series. By extracting a node between the delays, four types of signal strings delayed by 0, 1/(4fc), 1/(2fc), and 3/(4fc) as compared with a pulse amplitude signal string output from the delta-sigma modulation unit 204 are generated. The four types of the signal strings are input to the output switching unit 205d.

The output switching unit 205d associates values 0, 1, 2, and 3 corresponding to the control signal with the input four types of the signal strings (delay amounts 0, 1/(4fc), 1/(2fc), and 3/(4fc)), respectively.

Then, the output switching unit 205d selects, based on the control signal, one type out of the four types of the input signal strings, and outputs the one type of the signal string as an output signal string.

Note that, even when the clock in the above-described configuration is changed into a clock obtained by frequency-dividing the carrier frequency fc (a clock frequency fc/N (N is a positive integer)), the clock frequency of delta-sigma modulation does not affect other blocks. Such a configuration is also included in the present example embodiment.

In addition, in the present example embodiment, the phase sorting unit 206 includes four region divisions of 0° to 90°, 90° to 180°, 180° to 270°, and 270° to 360°. However, the number of divisions is not limited to four, and an arbitrary plurality of divisions can be made. In addition, along with change in the number of divisions, the configuration of the delay switching unit 205 can be also extended arbitrarily by changing the number of rows of the delays and the delay amount. The following indicates an arbitrary division configuration.

When assuming that the number of divisions is N, the phase sorting unit 206 sets N region divisions as 360×k/N° to 360×(k+1)/N° (k is an integer from 0 to N−1). In addition, when a phase value input to the phase sorting unit 206 is included in a region division of 360×m/N° (m is an integer equal to or greater than 0) to 360×(m+1)/N°, the phase sorting unit 206 outputs "m" as a value of the control signal.

The delays, which are constituent elements of the delay switching unit 205, are set to have N−1 rows and have a delay amount of 1/(Nfc), and are arranged in series. Thus, by designating the number of rows of the delays, N types of signal strings with a delay amount of k/(Nfc) (k is an integer from 0 to N−1) are generated. The signal strings are input to the output switching unit 205d. The output switching unit 205d allocates 0 to N−1 as row numbers of the delays to the input signals, and outputs a signal string of a row number of the delay that matches with the value "m" of the control signal.

Note that the region divisions of the phase sorting unit 206 are not limited to the ranges of the above region divisions, but can be also region divisions including an offset (M+360× k/N° to M+360×(k+1)/N°, where M is an offset value), for example. Such a configuration is also included in the present example embodiment.

In addition, regarding intervals of the region divisions, the intervals of the divisions are not limited to be equal intervals. In a case in which the region divisions of unequal intervals are set in the phase sorting unit 206, a delta-sigma modulator maintaining a zero current switch property can be configured by setting the delay amounts of the delays in delay switching unit 205 to be unequal intervals associated with the region divisions. Such a configuration is also included in the present example embodiment.

Note that a direction of an arrow in FIG. 5 indicates an example, but is not intended to limit a direction of a signal between blocks.

As described above, according to the present example embodiment, the delay switching unit 205 delays, based on the control signal from the phase sorting unit 206, the pulse amplitude signal. Thereby, the pulse amplitude signal is synchronized with the pulse phase signal, and thus generation of a thin pulse can be prevented. Accordingly, a zero current switching property in an amplifier is maintained. Therefore, according to the present example embodiment, a high-power-efficiency and low-design-cost transmission device is provided by enabling to implement, with a constant clock, delta-sigma modulation maintaining a zero current switching property in an amplifier.

(Fifth Example Embodiment)

Figure 6:
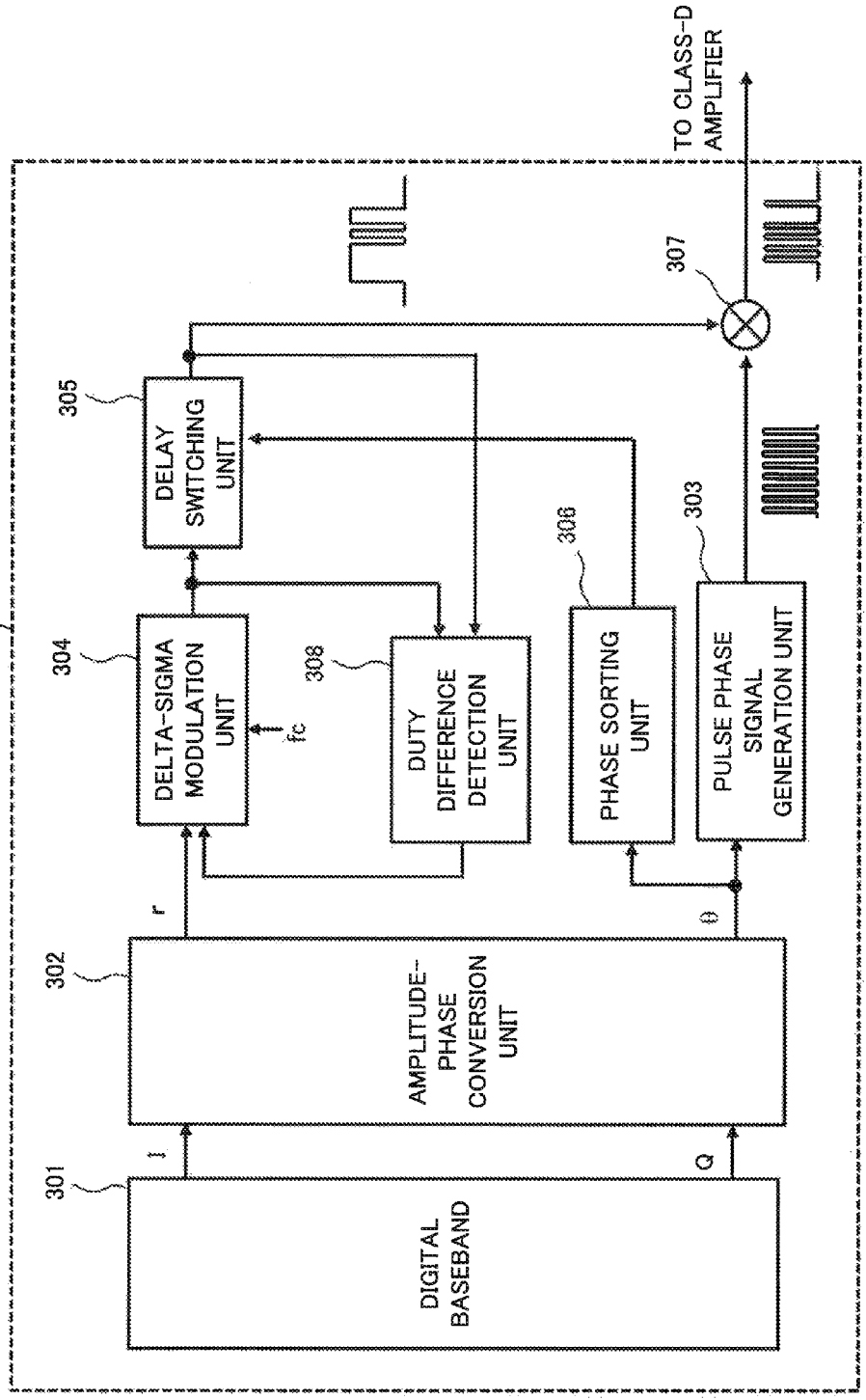
FIG. 6 is a block diagram illustrating a configuration of a delta-sigma modulator according to a fifth example embodiment of the present invention.

A transmission device according to a fifth example embodiment of the present invention has a configuration in which the delta-sigma modulator 100 of FIG. 3 is replaced with a delta-sigma modulator 300 of FIG. 6. The delta-sigma modulator 300 has a function of correcting an error in a pulse amplitude signal caused by the delay switching unit 105 in the delta-sigma modulator 100 dynamically changing a delay amount to be added to the pulse amplitude signal.

FIG. 6 is a block diagram illustrating a configuration of the delta-sigma modulator according to the present example embodiment. The delta-sigma modulator 300 in FIG. 6 includes a digital baseband 301, an amplitude-phase conversion unit 302, a pulse phase signal generation unit 303, a delta-sigma modulation unit 304, a delay switching unit 305, a phase sorting unit 306, a mixing unit 307, and a duty difference detection unit 308. Note that the digital baseband 301 and the amplitude-phase conversion unit 302 are the same as the digital baseband 101 and the amplitude-phase conversion unit 102 in FIG. 3, respectively. In addition, the pulse phase signal generation unit 303, the delay switching unit 305, the phase sorting unit 306, and the mixing unit 307 are the same as the pulse phase signal generation unit 103, the delay switching unit 105, the phase sorting unit 106, and the mixing unit 107 in FIG. 3, respectively. Thus, description of operations of the constituent elements that are the same as those of the constituent elements in FIG. 3 will be omitted.

The delta-sigma modulator 300 includes the duty difference detection unit 308 for correcting an error in a pulse amplitude signal caused by the delay switching unit 305 dynamically changing a delay amount to be added to the pulse amplitude signal.

When assuming that a value of an amplitude signal is r(t), a value of a phase signal is θ(t), an output pulse of the delta-sigma modulation unit 304 is rp(t), and a delay amount of the delay switching unit 305 is τ(θ), an error e(t) generated at the delay switching unit 305 is given as follows.

$$e(t)=rp(t)-rp(t+\tau(\theta))$$

At this time, an error eb(t) obtained by extracting only baseband components from frequency components of the error is as follows.

$$eb(t)=r(t)-r(t+\tau(\theta))$$

The errors of the baseband are a main factor of an error generated at the delay switching unit 305. Examples of a method of correcting these errors include a method of monitoring and feeding back how much a baseband component of a post-delay signal is deviated in comparison with a baseband component of a pre-delay signal. In addition, a baseband component included in a pulse signal can be calculated from a duty ratio of a pulse. Thus, the error eb(t) of the baseband can be calculated by detecting duty ratios of an input pulse and an output pulse of the delay switching unit 305 and a difference therebetween.

The duty difference detection unit 308 receives an output signal string of the delta-sigma modulation unit 304 and an output signal string of the delay switching unit 305 as inputs, and calculates a difference in duration of a High value between the both output signal strings within a fixed time interval. Further, the duty difference detection unit 308 outputs the difference after scaling with a predetermined value (assumed as α), and inputs the output difference to the delta-sigma modulation unit 304.

For example, assume that a time interval for measuring a duty difference is T and a difference in duration of a High value within the time interval (time for output of the delta-sigma modulation unit 304—time for output of the delay switching unit 305) is Td. At this time, an output value of the duty difference detection unit 308 becomes αTd/T obtained by multiplying Td by a scaling value a and a reciprocal of the measurement time T. Note that, for the scaling value a, a value that is the best in terms of a distortion property is selected by preliminarily simulating the entire device.

Figure 7:
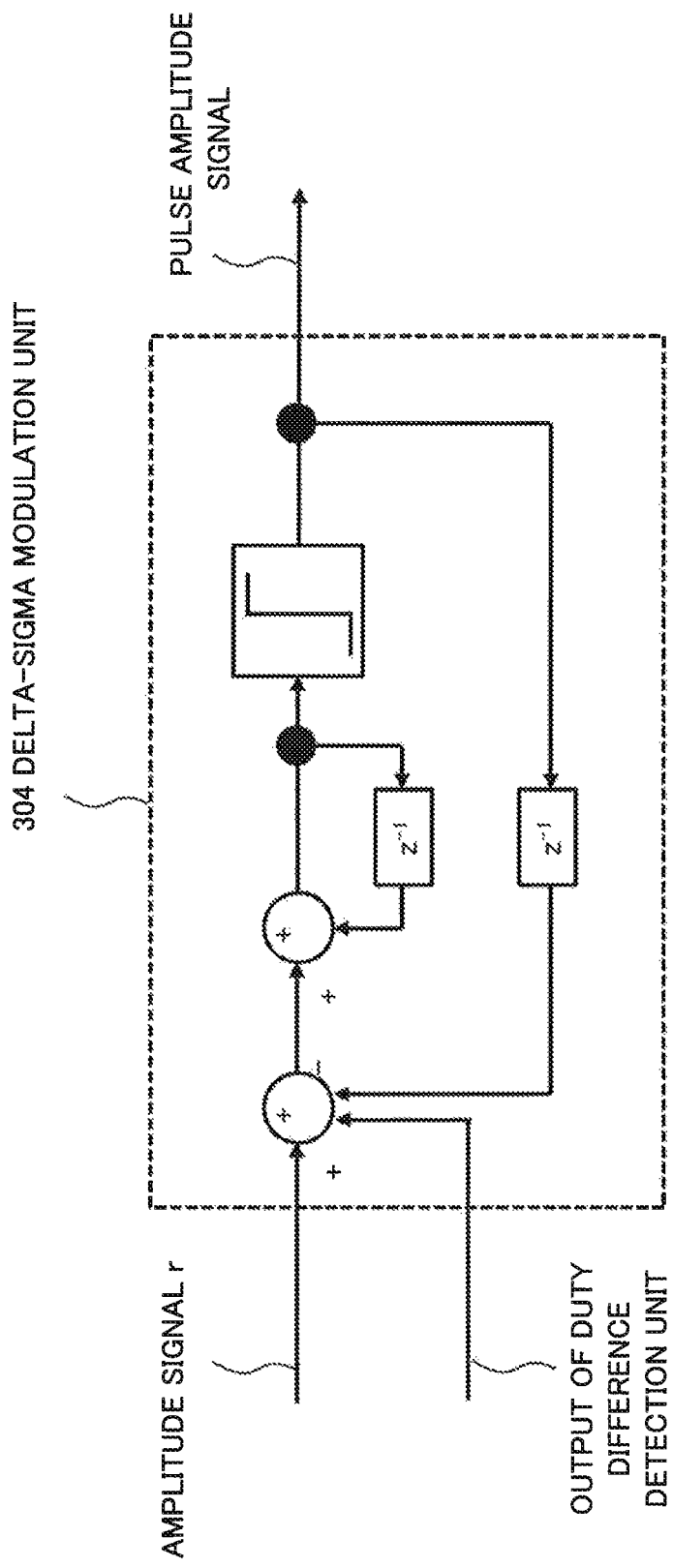
FIG. 7 is a diagram describing a function of the delta-sigma modulator according to the fifth example embodiment of the present invention.

FIG. 7 is a diagram describing how to feed back a value calculated by the duty difference detection unit 308 to the delta-sigma modulation unit 304. A degree in the delta-sigma modulation unit 304 is linear. An output value of the duty difference detection unit 308 is input in parallel with an amplitude signal r to an operation unit of delta-sigma modulation at a fixed time interval. Thus, the output value is fed back for generation of a pulse amplitude signal string. Accordingly, a baseband error to be generated at the delay switching unit 305 can be corrected at the delta-sigma modulation unit 304.

Note that the degree in the delta-sigma modulation unit 304 is not limited to linear, but quadratic or higher-degree delta-sigma modulation can also perform distortion correction by means of feedback in the same manner.

Note that a direction of an arrow in FIGS. 6 and 7 indicates an example, but is not intended to limit a direction of a signal between blocks.

According to the present example embodiment, the delay switching unit 305 delays, based on the control signal from the phase sorting unit 306, the pulse amplitude signal. Thereby, the pulse amplitude signal is synchronized with the pulse phase signal, and thus generation of a thin pulse can be prevented. Accordingly, a zero current switching property in an amplifier is maintained. Therefore, according to the present example embodiment, a high-power-efficiency and low-design-cost transmission device is provided by enabling to implement, with a constant clock, delta-sigma modulation maintaining a zero current switching property in an amplifier.

(Sixth Example Embodiment)

Figure 8:
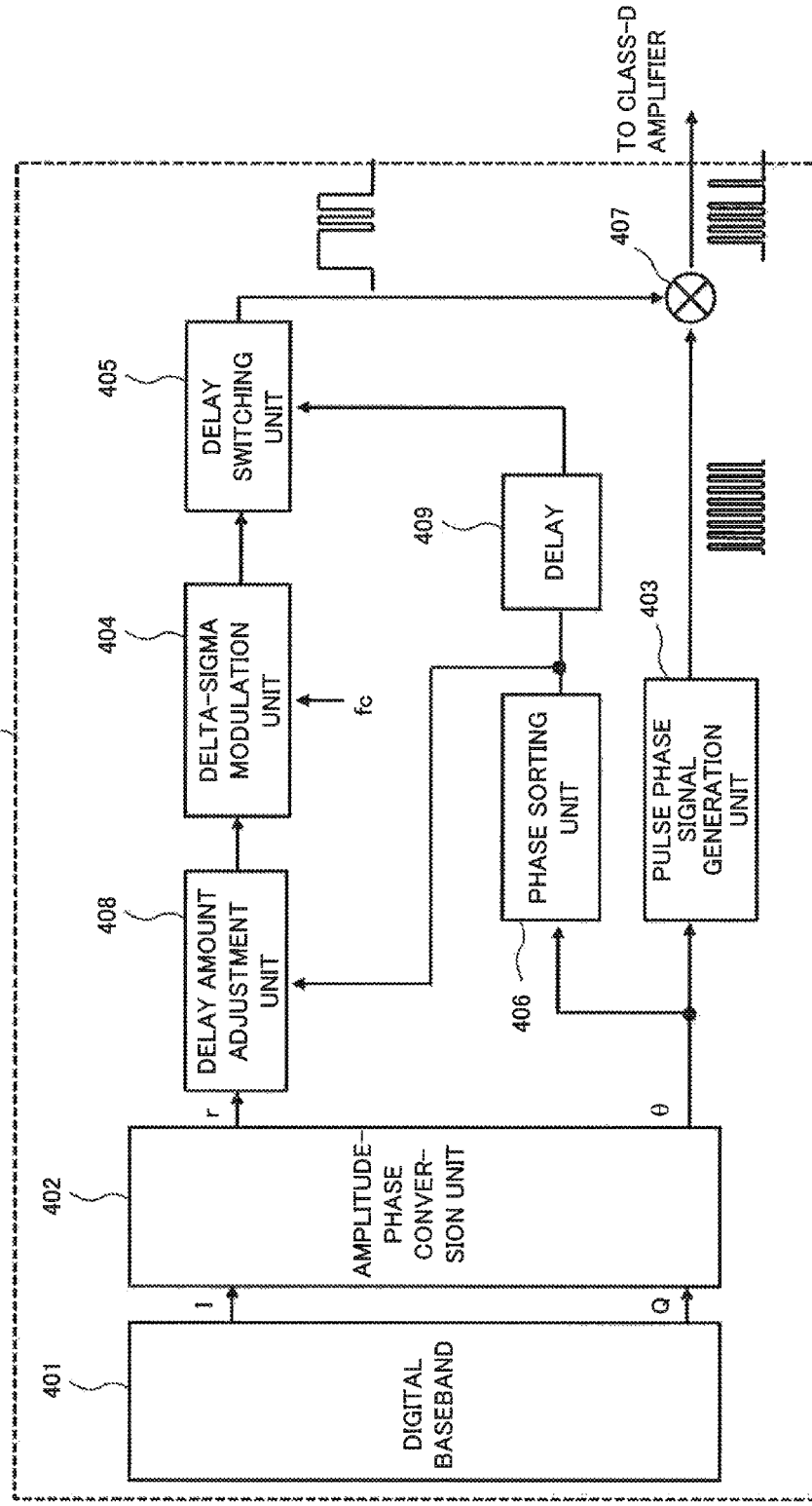
FIG. 8 is a block diagram illustrating a configuration of a delta-sigma modulator according to a sixth example embodiment of the present invention.

A transmission device according to a sixth example embodiment of the present invention has a configuration in which the delta-sigma modulator 100 of FIG. 3 is replaced with a delta-sigma modulator 400 of FIG. 8. The delta-sigma modulator 400 has a function of correcting an error in a pulse amplitude signal caused by the delay switching unit 105 in the delta-sigma modulator 100 dynamically changing a delay amount to be added to the pulse amplitude signal. The delta-sigma modulator 400 implements this function by using a method different from that of the delta-sigma modulator 300 of FIG. 6.

FIG. 8 is a block diagram illustrating a configuration of the delta-sigma modulator according to the present example embodiment. The delta-sigma modulator 400 in FIG. 8 includes a digital baseband 401, an amplitude-phase conversion unit 402, a pulse phase signal generation unit 403, a delta-sigma modulation unit 404, a delay switching unit 405, a phase sorting unit 406, a mixing unit 407, a delay amount adjustment unit 408, and a delay 409. Note that the digital baseband 401 and the amplitude-phase conversion unit 402 are the same as the digital baseband 101 and the amplitude-phase conversion unit 102 in FIG. 3, respectively. In addition, the pulse phase signal generation unit 403, the delta-sigma modulation unit 404, the delay switching unit 405, the phase sorting unit 406, and the mixing unit 407 are the same as the pulse phase signal generation unit 103, the delta-sigma modulation unit 104, the delay switching unit 105, the phase sorting unit 106, and the mixing unit 107, respectively. Thus, description of operations of the constituent elements that are the same as those of the constituent elements in FIG. 3 will be omitted.

The delta-sigma modulator 400 includes the delay amount adjustment unit 408 and the delay 409 for correcting an error in a pulse amplitude signal caused by the delay switching unit 405 dynamically changing a delay amount to be added to the pulse amplitude signal.

Assume that a value of an amplitude signal is r(t), a value of a phase signal is θ(t), an output pulse of the delta-sigma modulation unit 404 is rp(t), and a delay amount of the delay switching unit 405 is τ(θ). At this time, the delay amount adjustment unit 408 that generates τ'(θ) dependent on the value of the phase signal and making τ(θ)+τ'(θ) constant regardless of a value of θ is disposed immediately before input of the delta-sigma modulation unit 404.

Thus, a baseband component contained in the output pulse rp(t) of the delta-sigma modulation unit 404 becomes r(t+τ'(θ)), and a baseband component after passing through the delay switching unit 405 becomes r(t+τ'(θ)+τ(θ)). A baseband component contained in a pulse amplitude signal string becomes a value obtained by actuating a group delay τ'(θ)+τ(θ) on the amplitude signal r(t). Thus, an output pulse signal has no distortion generated when being synchronized with the phase signal.

The delay amount adjustment unit 408 outputs a signal to be input while switching, based on a control signal, a delay amount in a manner similar to the delay switching unit 405. The signal to be input at this time is an amplitude signal r, and is output to the delta-sigma modulation unit 404 after being added with a delay by the delay amount adjustment unit 408. Further, the delay amount to be added by the delay amount adjustment unit 408 is set such that a total value with the delay amount at the delay switching unit 405 becomes constant.

The delay 409 delays the control signal of the phase sorting unit 406 and outputs the control signal to the delay switching unit 405. A delay amount is set to a value being the same as the delay amount generated at the delta-sigma modulation unit 404.

As described above, change in the delay amount of a signal to be added at the delay switching unit 405 in synchronization with phase change is canceled out by change in the delay amount of the delay amount adjustment unit 408. Thus, an error in the pulse amplitude signal caused by the change in the delay amount is eliminated, and signal distortion is suppressed.

Figure 9:
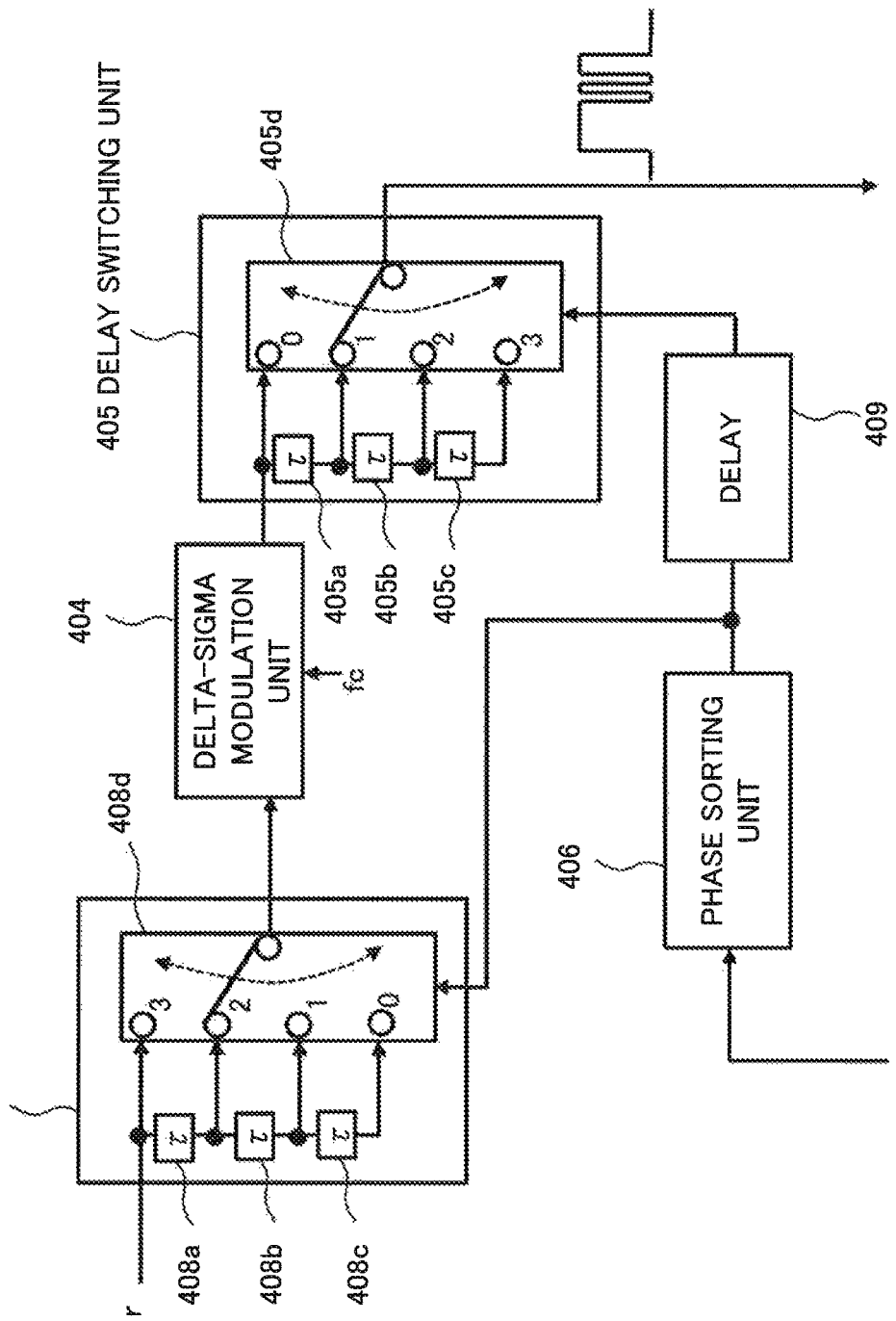
FIG. 9 is a block diagram illustrating a part of the configuration of the delta-sigma modulator according to the sixth example embodiment of the present invention.
Figure 10:
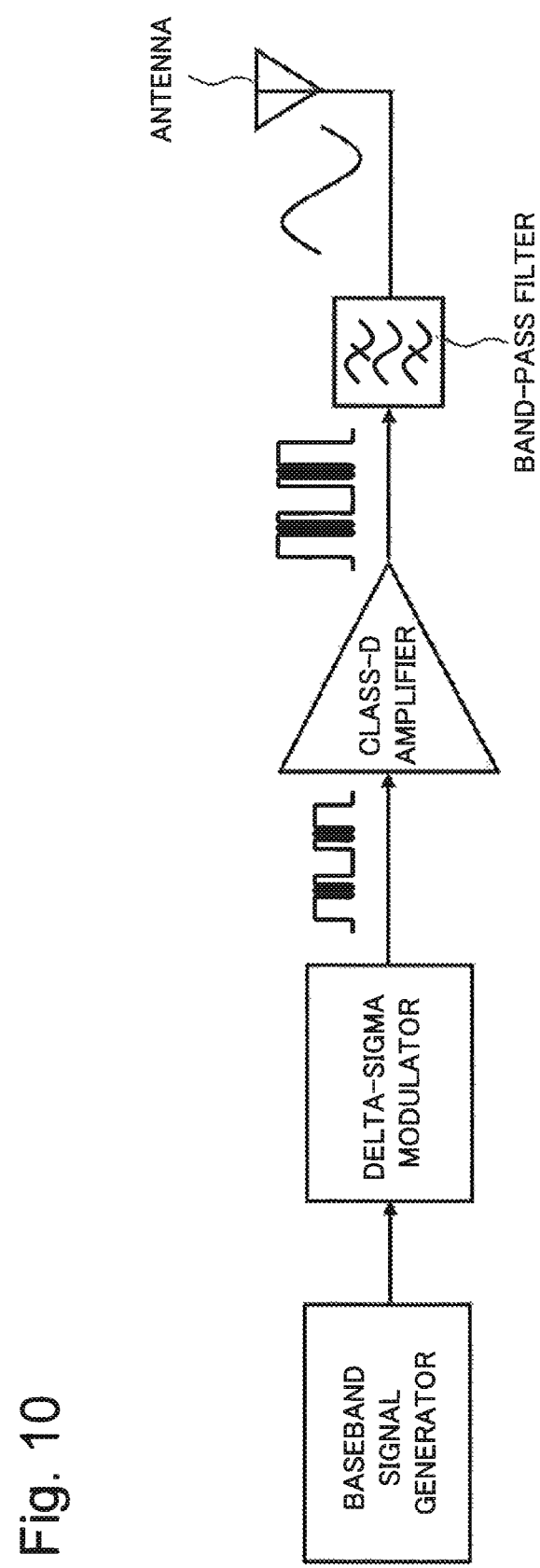
FIG. 10 is a block diagram illustrating a configuration of a digital transmitter using a delta-sigma modulator and a class-D amplifier in combination.
Figure 11:
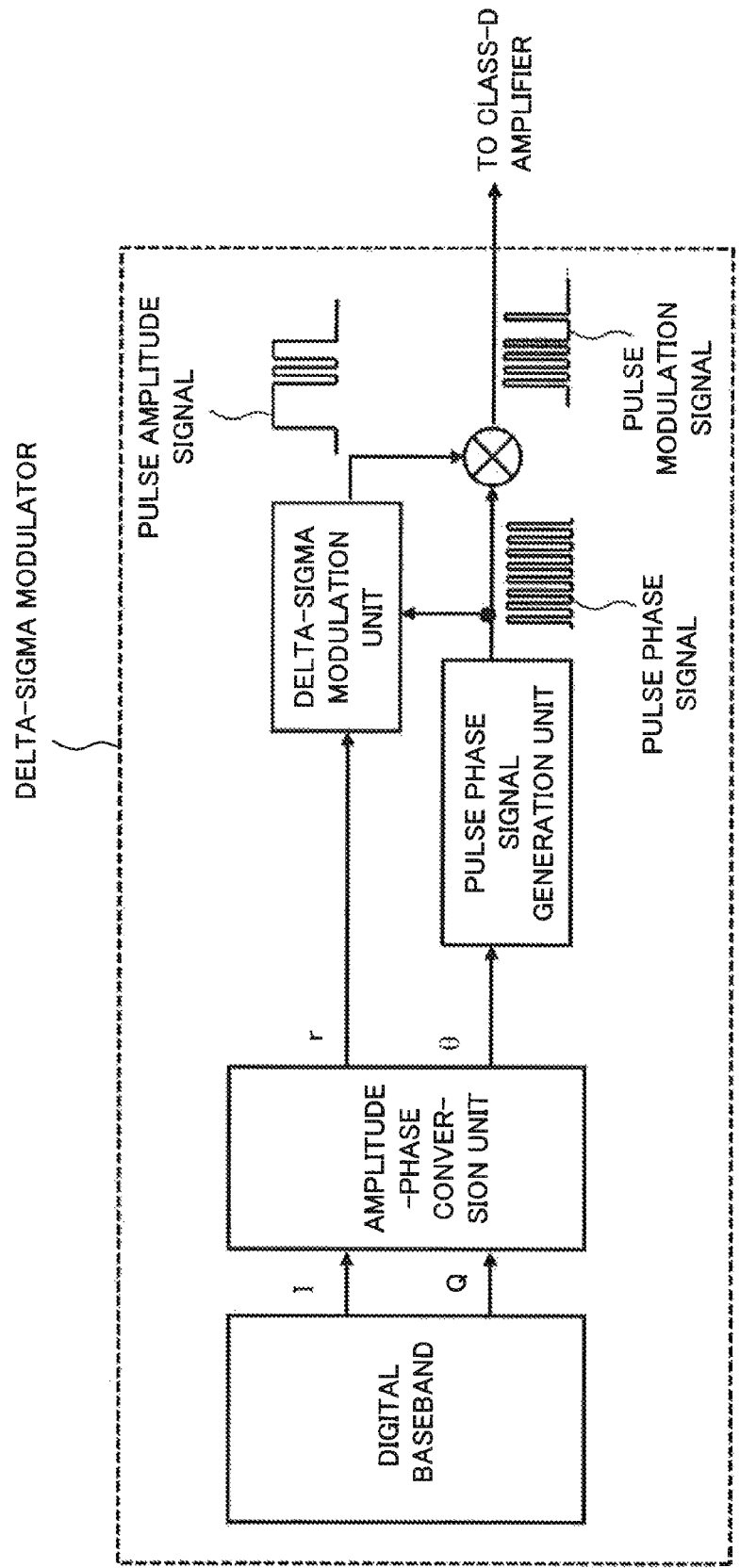
FIG. 11 is a block diagram illustrating a configuration of an envelope delta-sigma modulator disclosed in PTL 1.
Figure 12:
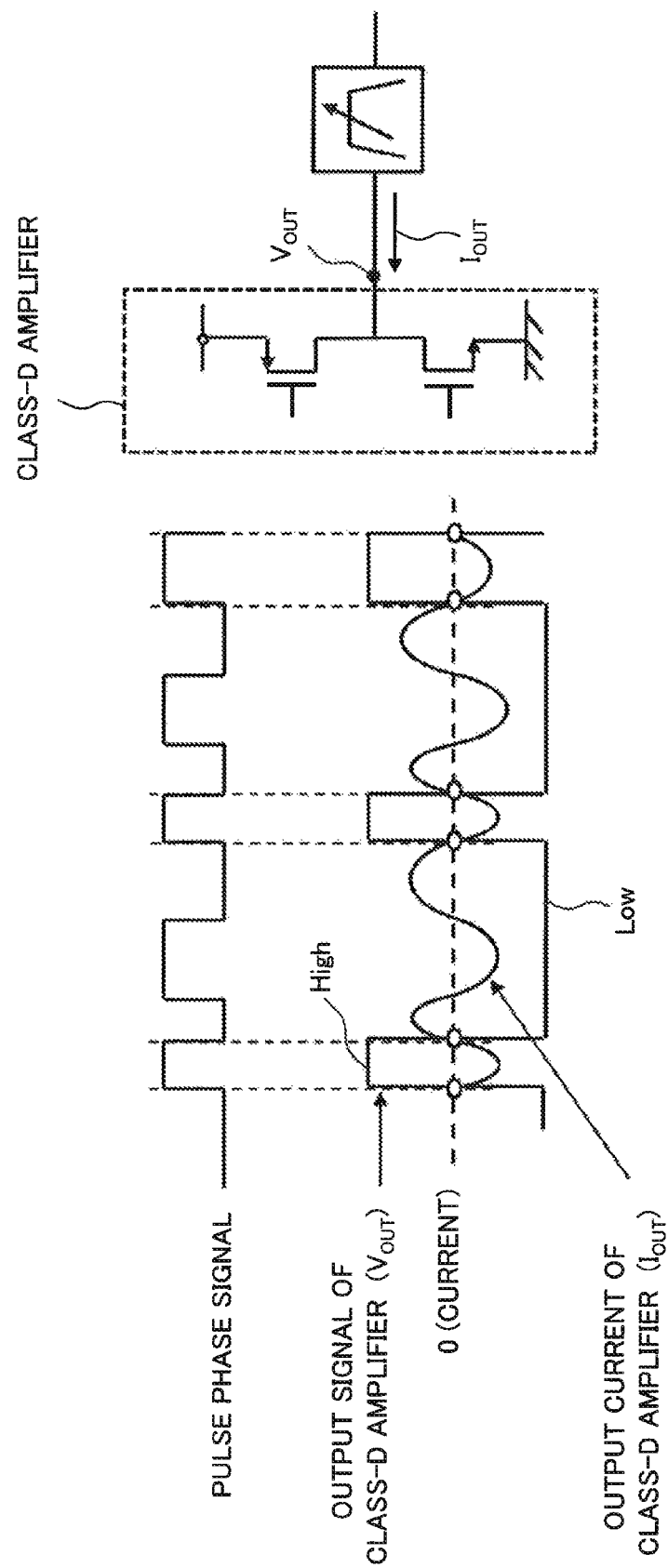
FIG. 12 is a diagram describing zero current switching in a class-D amplifier in accordance with an envelope delta-sigma modulation scheme.

FIG. 9 illustrates a configuration example of the delay amount adjustment unit 408 in a case in which the delay switching unit 405 includes a delay 405a, a delay 405b, a delay 405c, and an output switching unit 405d similarly to the configuration (the delay switching unit 205) of FIG. 5.

The delay amount adjustment unit 408 includes a delay 408a, a delay 408b, a delay 408c, and an output switching unit 408d similarly to the delay switching unit 405. Likewise, delay amounts of the respective delays are set as 1/(4fc), and then four types of amplitude signals r with delay amounts of 0, 1/(4fc), 1/(2fc), and 3/(4fc) are input to the output switching unit 408d. Then, the output switching unit 408d allocates control signals of 3, 2, 1, and 0, which are reverse to those of the output switching unit 405d of the delay switching unit 405, to corresponding nodes.

At this time, for example, when the control signal 0 is output from the phase sorting unit 406, the amplitude signal is delayed by 3/(4fc) at the delay amount adjustment unit 408, is delta-sigma modulated, and is thereafter delayed by 1/(4fc) at the delay switching unit 405. Accordingly, a total delay amount of the delay adjustment unit 408 and the delay switching unit 405 becomes 1/fc. Since a total delay amount becomes constant at 1/fc even in a case of another control signal, a delay amount in a pulse amplitude signal when viewed from the amplitude signal is 1/fc+a delay amount caused by delta-sigma modulation and is constant regardless of phase change. Therefore, no signal distortion is generated.

Note that, similarly to the third example embodiment, the number of phase divisions in the delay switching unit 405, the phase sorting unit 406, and the delay adjustment unit 408 is not limited to four, but can be extended into various divisions.

Note that a direction of an arrow in FIGS. 8 and 9 indicates an example, but is not intended to limit a direction of a signal between blocks.

According to the present example embodiment, the delay switching unit 405 delays, based on the control signal from the phase sorting unit 406, the pulse amplitude signal. Thereby, the pulse amplitude signal is synchronized with the pulse phase signal, and thus generation of a thin pulse can be prevented. Accordingly, a zero current switching property in an amplifier is maintained. Therefore, according to the present example embodiment, a high-power-efficiency and low-design-cost transmission device is provided by enabling to implement, with a constant clock, delta-sigma modulation maintaining a zero current switching property in an amplifier.

The present invention is not limited to the above example embodiments, but may be modified in various ways within the scope of the invention described in the claims. Such modifications are also included within the scope of the present invention.

The whole or part of the example embodiments disclosed above can be described as, but not limited to, the following supplementary notes.

Supplementary Notes (Supplementary Note 1)

A delta-sigma modulator including:

a pulse phase signal generation unit that generates a pulse phase signal from a phase signal;

a delta-sigma modulation unit that generates a pulse amplitude signal obtained by delta-sigma modulating an amplitude signal with a constant clock;

a phase sorting unit that outputs, based on the phase signal, a control signal;

a delay switching unit that delays, based on the control signal, the pulse amplitude signal; and a mixing unit that outputs a pulse string obtained by multiplying the delayed pulse amplitude signal by the pulse phase signal.

(Supplementary Note 2)

The delta-sigma modulator according to Supplementary note 1, wherein the delay switching unit delays the pulse amplitude signal in such a manner that a timing at which the pulse amplitude signal changes from Low to High occurs when the pulse phase signal is Low.

(Supplementary Note 3)

The delta-sigma modulator according to Supplementary note 1 or 2, wherein the phase sorting unit sorts, based on preset region division, the phase signal, and outputs, based on the sorting, the control signal.

(Supplementary Note 4)

The delta-sigma modulator according to any one of Supplementary notes 1 to 3, wherein the phase sorting unit determines which region of N (N is a positive integer) divided regions k×360/N° to (k+1)×360/N° (k is an integer from 0 to N−1k ) a value of the phase signal is included, and outputs the control signal corresponding to a determination result.

(Supplementary Note 5)

The delta-sigma modulator according to any one of Supplementary notes 1 to 4, wherein the delay switching unit delays the pulse amplitude signal by a delay amount k/(Nfc) (fc is a carrier frequency) (k is an integer from 0 to N−1) in accordance with the control signal.

(Supplementary Note 6)

The delta-sigma modulator according to any one of Supplementary notes 1 to 5, further including a delay amount adjustment unit that applies a delay that makes a delay amount of the delayed pulse amplitude signal constant regardless of the control signal, to the amplitude signal in accordance with the control signal.

(Supplementary Note 7)

The delta-sigma modulator according to Supplementary note 6, wherein the delay amount adjustment unit is provided between the amplitude-phase conversion unit and the delta-sigma modulation unit.

(Supplementary Note 8)

The delta-sigma modulator according to any one of Supplementary notes 1 to 5, further including a duty difference detection unit that detects a difference in a duty ratio between an output of the delta-sigma modulation unit and an output of the delay switching unit, and adds the difference in the duty ratio after scaling to an operation of the delta-sigma modulation unit.

(Supplementary Note 9)

The delta-sigma modulator according to any one of Supplementary notes 1 to 8, wherein the pulse phase signal generation unit includes a mixer and a comparator, and the phase signal is upconverted by the mixer into a carrier frequency fc, is thereafter converted by the comparator into a binary signal of Low and High, and is output as the pulse phase signal.

(Supplementary Note 10)

The delta-sigma modulator according to any one of Supplementary Notes 1 to 9, wherein a frequency of the constant clock of the delta-sigma modulation unit is a carrier frequency fc or a frequency-divided value thereof.

(Supplementary Note 11)

A delta-sigma modulation method including:

generating a pulse phase signal from a phase signal;

generating a pulse amplitude signal obtained by delta-sigma modulating an amplitude signal with a constant clock;

delaying, based on the phase signal, the pulse amplitude signal; and outputting a pulse string obtained by multiplying the delayed pulse amplitude signal by the pulse phase signal.

(Supplementary Note 12)

The delta-sigma modulation method according to Supplementary note 11, further including outputting, based on the phase signal, a control signal, and delaying, based on the control signal, the pulse amplitude signal.

(Supplementary Note 13)
The delta-sigma modulation method according to Supplementary note 11 or 12, further including delaying the pulse amplitude signal in such a manner that a timing at which the pulse amplitude signal changes from Low to High occurs when the pulse phase signal is Low.

(Supplementary Note 14)
The delta-sigma modulation method according to Supplementary note 12 or 13, further including sorting, based on preset region division, the phase signal, and outputting, based on the sorting, the control signal.

(Supplementary Note 15)
The delta-sigma modulation method according to any one of Supplementary notes 12 to 14, further including determining which region of N (N is a positive integer) divided regions k×360/N° to (k+1)×360/N° (k is an integer from 0 to N−1) a value of the phase signal is included, and outputting the control signal corresponding to a determination result.

(Supplementary Note 16)
The delta-sigma modulation method according to any one of Supplementary notes 12 to 15, further including delaying the pulse amplitude signal by a delay amount k/(Nfc) (fc is a carrier frequency) (k is an integer from 0 to N−1) in accordance with the control signal.

(Supplementary Note 17)
The delta-sigma modulation method according to any one of Supplementary notes 12 to 16, further including applying a delay that makes a delay amount of the delayed pulse amplitude signal constant regardless of the control signal, to the amplitude signal in accordance with the control signal.

(Supplementary Note 18)
The delta-sigma modulation method according to any one of Supplementary notes 12 to 16, further including detecting a difference in a duty ratio between the pulse amplitude signal and the pulse amplitude signal delayed based on the control signal, and adding the difference in the duty ratio after scaling to an operation of the delta-sigma modulation.

(Supplementary Note 19)
The delta-sigma modulation method according to any one of Supplementary notes 11 to 18, wherein the phase signal is upconverted into a carrier frequency fc, is thereafter converted into a binary signal of Low and High, and is output as the pulse phase signal.

(Supplementary Note 20)
The delta-sigma modulation method according to any one of Supplementary notes 11 to 19, wherein a frequency of the constant clock of the delta-sigma modulation is a carrier frequency fc or a frequency-divided value thereof.

(Supplementary Note 21)
A transmission device including a signal generator, a delta-sigma modulator, an amplifier, and a band-pass filter, wherein
the signal generator generates a baseband signal as an input signal,
the delta-sigma modulator includes:
a digital baseband unit that generates an IQ signal from the baseband signal;
an amplitude-phase conversion unit that converts the IQ signal into an amplitude signal and a phase signal;
a pulse phase signal generation unit that generates a pulse phase signal from the phase signal;
a delta-sigma modulation unit that generates a pulse amplitude signal obtained by delta-sigma modulating the amplitude signal with a constant clock;
a phase sorting unit that outputs, based on the phase signal, a control signal;
a delay switching unit that delays, based on the control signal, the pulse amplitude signal; and
a mixing unit that outputs a pulse string obtained by multiplying the delayed pulse amplitude signal by the pulse phase signal,
the amplifier amplifies the pulse string, and
the band-pass filter generates an output signal obtained by reconstructing the amplified input signal by passing the amplified pulse string.

(Supplementary Note 22)
The transmission device according to Supplementary note 21, wherein the amplifier is a class-D amplifier.

(Supplementary Note 23)
The transmission device according to Supplementary note 21 or 22, wherein the delay switching unit delays the pulse amplitude signal in such a manner that a timing at which the pulse amplitude signal changes from Low to High occurs when the pulse phase signal is Low.

(Supplementary Note 24)
The transmission device according to any one of Supplementary notes 21 to 23, wherein the phase sorting unit sorts, based on preset region division, the phase signal, and outputs, based on the sorting, the control signal.

(Supplementary Note 25)
The transmission device according to any one of Supplementary notes 21 to 24, wherein the phase sorting unit determines which region of N (N is a positive integer) divided regions k×360/N° to (k+1)×360/N° (k is an integer from 0 to N−1) a value of the phase signal is included, and outputs the control signal corresponding to a determination result.

(Supplementary Note 26)
The transmission device according to any one of Supplementary notes 21 to 25, wherein the delay switching unit delays the pulse amplitude signal by a delay amount k/(Nfc) (fc is a carrier frequency) (k is an integer from 0 to N−1) in accordance with the control signal.

(Supplementary note 27)
The transmission device according to any one of Supplementary notes 21 to 26, further including a delay amount adjustment unit that applies a delay that makes a delay amount of the delayed pulse amplitude signal constant regardless of the control signal, to the amplitude signal in accordance with the control signal.

(Supplementary Note 28)
The transmission device according to Supplementary note 27, wherein the delay amount adjustment unit is provided between the amplitude-phase conversion unit and the delta-sigma modulation unit.

(Supplementary Note 29)
The transmission device according to any one of Supplementary notes 21 to 26, further including a duty difference detection unit that detects a difference in a duty ratio between an output of the delta-sigma modulation unit and an output of the delay switching unit, and adds the difference in the duty ratio after scaling to an operation of the delta-sigma modulation unit.

(Supplementary Note 30)
The transmission device according to any one of Supplementary notes 21 to 29, wherein the pulse phase signal generation unit includes a mixer and a comparator, and the phase signal is upconverted by the mixer into a carrier frequency fc, is thereafter converted by the comparator into a binary signal of Low and High, and is output as the pulse phase signal.

(Supplementary Note 31)

The transmission device according to any one of Supplementary notes 21 to 30, wherein a frequency of the constant clock of the delta-sigma modulation unit is a carrier frequency fc or a frequency-divided value thereof.

(Supplementary Note 32)

A transmission method including:

generating an IQ signal from a baseband signal as an input signal;

converting the IQ signal into an amplitude signal and a phase signal;

generating a pulse phase signal from the phase signal;

generating a pulse amplitude signal obtained by delta-sigma modulating the amplitude signal with a constant clock;

delaying, based on the phase signal, the pulse amplitude signal;

outputting a pulse string obtained by multiplying the delayed pulse amplitude signal by the pulse phase signal;

amplifying the pulse string; and generating and transmitting an output signal obtained by reconstructing the amplified input signal by passing the amplified pulse string through a band-pass filter.

(Supplementary Note 33)

The transmission method according to Supplementary note 32, further including outputting, based on the phase signal, a control signal, and delaying, based on the control signal, the pulse amplitude signal.

(Supplementary Note 34)

The transmission method according to Supplementary note 32 or 33, wherein the pulse string is amplified with a class-D amplifier.

(Supplementary Note 35)

The transmission method according to any one of Supplementary notes 32 to 34, further including delaying the pulse amplitude signal in such a manner that a timing at which the pulse amplitude signal changes from Low to High occurs when the pulse phase signal is Low.

(Supplementary Note 36)

The transmission method according to any one of Supplementary notes 33 to 35, further including sorting, based on preset region division, the phase signal, and outputting, based on the sorting, the control signal.

(Supplementary Note 37)

The transmission method according to any one of Supplementary notes 33 to 36, further including determining which region of N (N is a positive integer) divided regions k×360/N° to (k+1)×360/N° (k is an integer from 0 to N−1) a value of the phase signal is included, and outputting the control signal corresponding to a determination result.

(Supplementary Note 38)

The transmission method according to any one of Supplementary notes 33 to 37, further including delaying the pulse amplitude signal by a delay amount k/(Nfc) (fc is a carrier frequency) (k is an integer from 0 to N−1) in accordance with the control signal.

(Supplementary Note 39)

The transmission method according to any one of Supplementary notes 33 to 38, further including applying a delay that makes a delay amount of the delayed pulse amplitude signal constant regardless of the control signal, to the amplitude signal in accordance with the control signal.

(Supplementary Note 40)

The transmission method according to any one of Supplementary notes 33 to 38, further including detecting a difference in a duty ratio between the pulse amplitude signal and the pulse amplitude signal delayed based on the control signal, and adding the difference in the duty ratio after scaling to an operation of the delta-sigma modulation.

(Supplementary Note 41)

The transmission method according to any one of Supplementary notes 32 to 40, wherein the phase signal is upconverted into a carrier frequency fc, is thereafter converted into a binary signal of Low and High, and is output as the pulse phase signal.

(Supplementary Note 42)

The transmission method according to any one of Supplementary notes 32 to 41, wherein a frequency of the constant clock of the delta-sigma modulation is a carrier frequency fc or a frequency-divided value thereof.

This application is based upon and claims the benefit of priority from Japanese Patent Application No. 2014-247164, filed on Dec. 5, 2014, the disclosure of which is incorporated herein in its entirety by reference.

INDUSTRIAL APPLICABILITY

The present invention is applicable to a digital transmitter, particularly, a transmitter that delta-sigma modulates a digital signal for transmission.

REFERENCE SIGNS LIST 1, 3, 100, 200, 300, 400 Delta-sigma modulator
2, 10 Transmission device
4 Amplifier
5, 110 Band-pass filter
6 Signal generator
11, 33, 103, 203, 303, 403 Pulse phase signal generation unit
12, 34, 104, 204, 304, 404 Delta-sigma modulation unit
14, 35, 105, 205, 305, 405 Delay switching unit
13, 36, 106, 206, 306, 406 Phase sorting unit
15, 37, 107, 207, 307, 407 Mixing unit
31 Digital baseband unit
32, 102, 202, 302, 402 Amplitude-phase conversion unit
103a Upconverter
103b Comparator
108 Driver amplifier
109 Class-D amplifier
109a, 109b Switching element
109c Power supply
111 Load
205a, 205b, 205c, 405a, 405b, 405c, 408a, 408b, 408c Delay
205d, 405d, 408d Output switching unit
308 Duty difference detection unit
408 Delay amount adjustment unit
409 Delay

What is claimed is:

1. A delta-sigma modulator including:
 a pulse phase signal generation circuit that generates a pulse phase signal from a phase signal;
 a delta-sigma modulation circuit that generates a pulse amplitude signal obtained by delta-sigma modulating an amplitude signal with a constant clock;
 a phase sorting circuit that outputs, based on the phase signal, a control signal;
 a delay switching circuit that delays, based on the control signal, the pulse amplitude signal; and
 a mixing circuit that outputs a pulse string obtained by multiplying the delayed pulse amplitude signal by the pulse phase signal.

2. The delta-sigma modulator according to claim 1, wherein the delay switching circuit delays the pulse amplitude signal in such a manner that a timing at which the pulse amplitude signal changes from Low to High occurs when the pulse phase signal is Low.

3. The delta-sigma modulator according to claim 1, wherein the phase sorting circuit sorts, based on preset region division, the phase signal, and outputs, based on the sorting, the control signal.

4. The delta-sigma modulator according to claim 1, wherein the phase sorting circuit determines which region of N (N is a positive integer) divided regions $k \times 360/N°$ to $(k+1) \times 360/N°$ (k is an integer from 0 to N-1) a value of the phase signal is included, and outputs the control signal corresponding to a determination result.

5. The delta-sigma modulator according to claim 1, wherein the delay switching circuit delays the pulse amplitude signal by a delay amount $k/(Nfc)$ (fc is a carrier frequency) (k is an integer from 0 to N-1) in accordance with the control signal.

6. The delta-sigma modulator according to claim 1, further including a delay amount adjustment circuit that applies a delay that makes a delay amount of the delayed pulse amplitude signal constant regardless of the control signal, to the amplitude signal in accordance with the control signal.

7. The delta-sigma modulator according to claim 1, further including a duty difference detection circuit that detects a difference in a duty ratio between an output of the delta-sigma modulation circuit and an output of the delay switching circuit, and adds the difference in the duty ratio after scaling to an operation of the delta-sigma modulation circuit.

8. A delta-sigma modulation method including:
generating a pulse phase signal from a phase signal;
generating a pulse amplitude signal obtained by delta-sigma modulating an amplitude signal with a constant clock;
delaying, based on the phase signal, the pulse amplitude signal; and
outputting a pulse string obtained by multiplying the delayed pulse amplitude signal by the pulse phase signal.

9. A transmission device including a signal generator, a delta-sigma modulator, an amplifier, and a band-pass filter, wherein
the signal generator generates a baseband signal as an input signal,
the delta-sigma modulator includes:
a digital baseband circuit that generates an IQ signal from the baseband signal;
an amplitude-phase conversion circuit that converts the IQ signal into an amplitude signal and a phase signal;
a pulse phase signal generation circuit that generates a pulse phase signal from the phase signal;
a delta-sigma modulation circuit that generates a pulse amplitude signal obtained by delta-sigma modulating the amplitude signal with a constant clock;
a phase sorting circuit that outputs, based on the phase signal, a control signal;
a delay switching circuit that delays, based on the control signal, the pulse amplitude signal; and
a mixing circuit that outputs a pulse string obtained by multiplying the delayed pulse amplitude signal by the pulse phase signal,
the amplifier amplifies the pulse string, and
the band-pass filter generates an output signal obtained by reconstructing the amplified input signal by passing the amplified pulse string.

\* \* \* \* \*